(12) United States Patent
Anglin et al.

(10) Patent No.: US 11,127,593 B2
(45) Date of Patent: Sep. 21, 2021

(54) TECHNIQUES AND APPARATUS FOR ELONGATION PATTERNING USING ANGLED ION BEAMS

(71) Applicant: Varian Semiconductor Equipment Associates, Inc., Gloucester, MA (US)

(72) Inventors: Kevin R. Anglin, Somerville, MA (US); Simon Ruffell, South Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 16/053,329

(22) Filed: Aug. 2, 2018

(65) Prior Publication Data

US 2019/0355581 A1     Nov. 21, 2019

Related U.S. Application Data

(60) Provisional application No. 62/673,604, filed on May 18, 2018.

(51) Int. Cl.
| | | |
|---|---|---|
| *H01L 21/26* | (2006.01) | |
| *H01L 21/263* | (2006.01) | |
| *H01L 21/033* | (2006.01) | |
| *H01L 21/67* | (2006.01) | |
| *H01J 37/32* | (2006.01) | |
| *H01L 21/311* | (2006.01) | |

(52) U.S. Cl.
CPC .... *H01L 21/0337* (2013.01); *H01J 37/32422* (2013.01); *H01J 37/32449* (2013.01); *H01J 37/32899* (2013.01); *H01L 21/0335* (2013.01); *H01L 21/31116* (2013.01); *H01L 21/67069* (2013.01); *H01J 2237/3341* (2013.01)

(58) Field of Classification Search
CPC ............................. H01L 21/26; H01L 21/2633
See application file for complete search history.

(56) References Cited

U.S. PATENT DOCUMENTS

| 9,589,811 B2 | 3/2017 | Ruffell | |
|---|---|---|---|
| 2004/0150029 A1* | 8/2004 | Lee | H01L 29/41791 |
| | | | 257/308 |
| 2015/0083581 A1 | 3/2015 | Sherman et al. | |
| 2015/0311073 A1 | 10/2015 | Srinivasan et al. | |
| 2016/0005594 A1 | 1/2016 | Omstead et al. | |
| 2016/0379816 A1 | 12/2016 | Ruffell et al. | |
| 2017/0110579 A1* | 4/2017 | Chang | H01L 29/1083 |
| 2017/0133491 A1* | 5/2017 | Ruffell | H01L 21/3065 |
| 2017/0263460 A1 | 9/2017 | Ruffell et al. | |
| 2018/0047632 A1* | 2/2018 | Zhang | H01L 21/76816 |

* cited by examiner

*Primary Examiner* — Thomas T Pham
(74) *Attorney, Agent, or Firm* — Kacvinsky Daisak Bluni PLLC

(57) ABSTRACT

A method of patterning a substrate may include providing a cavity in a layer, disposed on the substrate. The cavity may have a first length along a first direction and a first width along a second direction, perpendicular to the first direction. The method may include directing first angled ions in a first exposure to the cavity, wherein after the first exposure the cavity has a second length, greater than the first length; directing normal ions in a second exposure to the cavity, wherein the cavity retains the second length after the second exposure; and directing second angled ions to the cavity is a third exposure, subsequent to the second exposure, wherein the cavity has a third length, greater than the second length, after the third exposure.

10 Claims, 5 Drawing Sheets

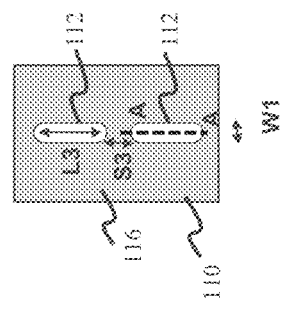
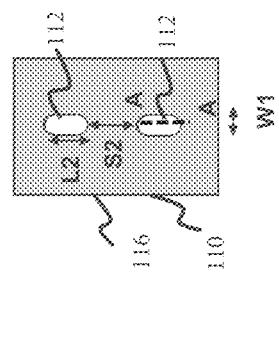
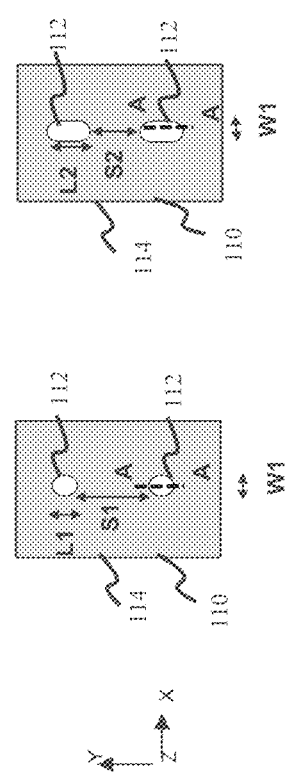

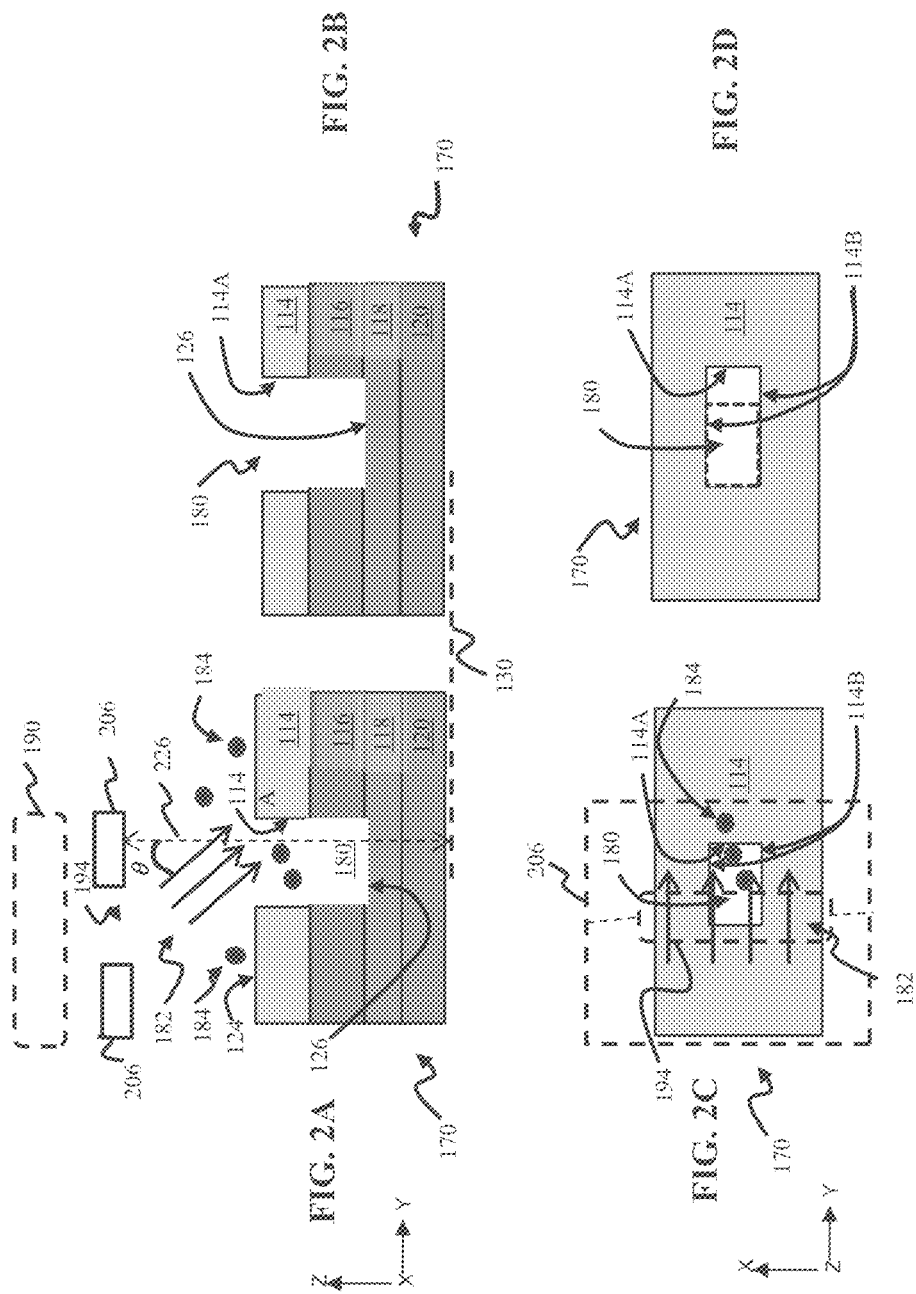

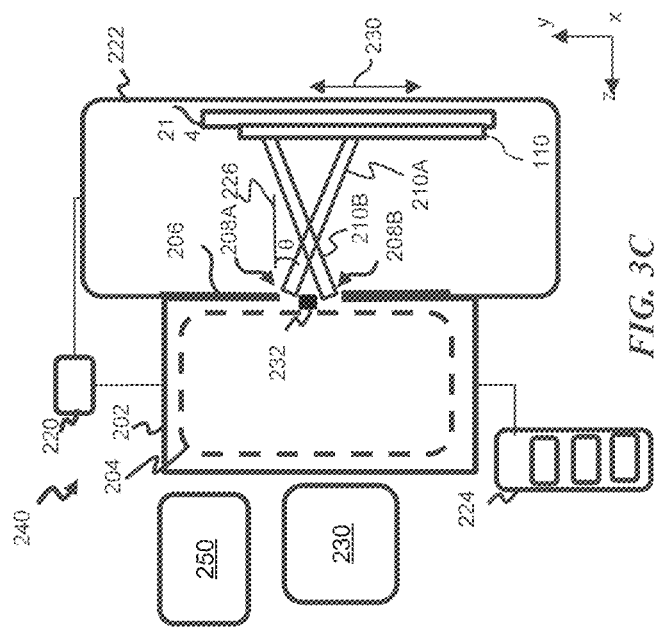
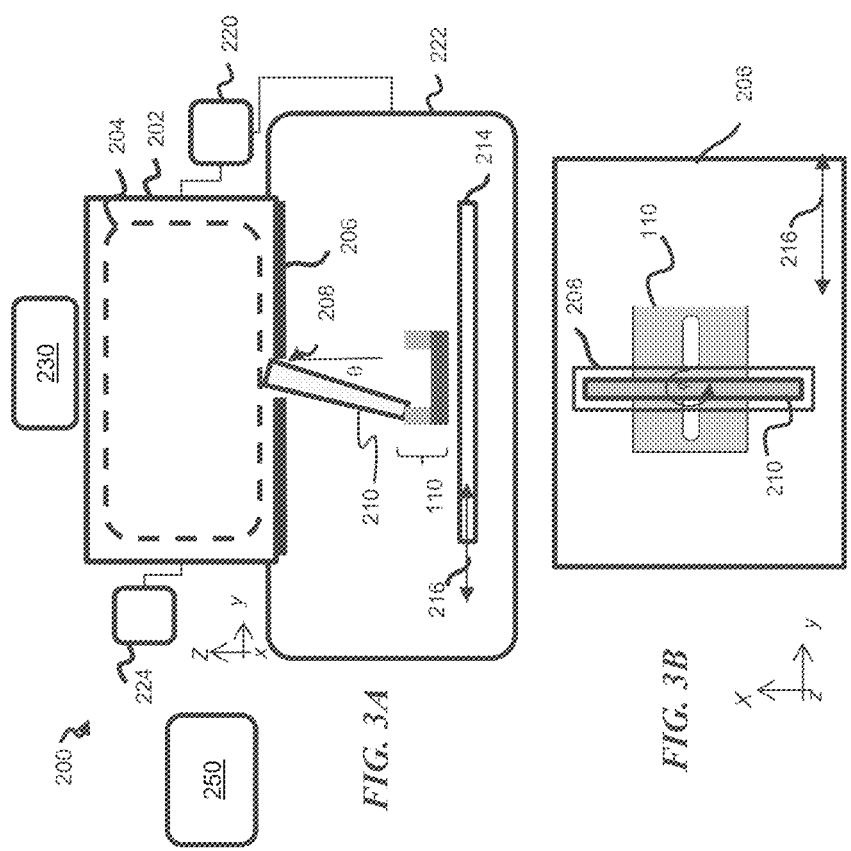
FIG. 3C
FIG. 3A
FIG. 3B

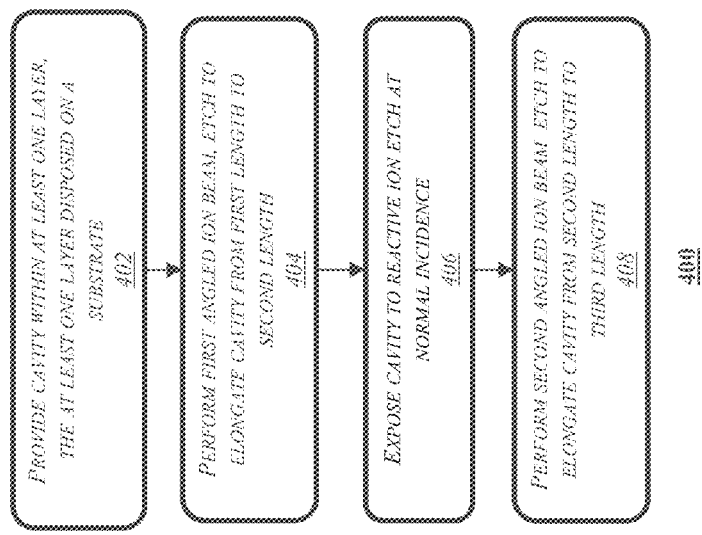

TECHNIQUES AND APPARATUS FOR ELONGATION PATTERNING USING ANGLED ION BEAMS

RELATED APPLICATIONS

This application claims priority to U.S. Provisional Patent Application No. 62/673,604, file May 18, 2018, entitled TECHNIQUES AND APPARATUS FOR ELONGATION PATTERNING USING ANGLED ION BEAMS, and incorporated by reference herein in its entirety.

FIELD

The present embodiments relate to transistor processing techniques, and more particularly, to etch processing for patterning devices.

BACKGROUND

As semiconductor devices continue to scale to smaller dimensions, the ability to pattern features becomes increasingly difficult. These difficulties include in one aspect the ability to obtain features at a target size for a given technology generation. Another difficult is the ability to obtain the correct shape of a patterned feature, as well as packing density, and the ability to obtain correct overlay to structures patterned in previous processing operations.

In another example, overlay error represents a challenge to extend lithography to advanced nodes. While multi-patterning has been used to address feature width and pitch reduction of features, overlay becomes an increasing challenge. One reason is as the feature line/space is reduced, the overlay requirement becomes smaller. A second reason is as multiple cut masks are coming into use, multiple overlay issues between cut masks and the other features on a substrate arise.

One further challenge is to print small features such as cavities, where the cavities are separated by a small distance, on the order of nanometers or tens of nanometers in present day technology. As an example, printing of adjacent linear features with the appropriate tip-to-tip distance becomes increasing challenging as overall pitch of device structures continues to shrink.

With respect to these and other considerations the present improvements may be useful.

BRIEF SUMMARY

In one embodiment, a method of patterning a substrate may include providing a cavity in a layer, disposed on the substrate. The cavity may have a first length along a first direction and a first width along a second direction, perpendicular to the first direction. The method may further include directing first angled ions in a first exposure to the cavity, wherein after the first exposure the cavity has a second length, greater than the first length. The method may also include directing normal-incidence ions in a second exposure to the cavity, wherein the cavity retains the second length after the second exposure. The method may include directing second angled ions to the cavity is a third exposure, subsequent to the second exposure, wherein the cavity has a third length, greater than the second length, after the third exposure.

In another embodiment, a system may include a transfer chamber, arranged to transport a substrate between a plurality of locations. The system may include a first angled ion beam chamber, coupled to the transfer chamber, to direct a first angled ion beam to the substrate. The system may further include a vertical etch chamber, the vertical etch chamber coupled to the transfer chamber, to supply vertical ions to the substrate. The system may also include a second angled ion beam chamber, the second angled ion beam chamber coupled to the transfer chamber, to direct a second angled ion beam to the substrate.

In a further embodiment, an apparatus may include a plasma chamber coupled to receive power from a power supply, and a process chamber, electrically coupled to the plasma chamber via a bias supply, the process chamber further including a substrate stage. The apparatus may also include an extraction plate disposed between the plasma chamber and process chamber, and defining an angled ion beam, as well as a controller, coupled to at least one of: the power supply, bias supply, and substrate stage. The controller may include a processor; and a memory unit coupled to the processor, including an ion beam control routine, where the ion beam control routine is operative on the processor to control the angled ion beam. The ion beam control routine may include an angle control processor to receive an endpoint signal, and to send a control signal to adjust operation of at least one of the power supply, bias supply, and substrate stage, based upon the endpoint signal.

BRIEF DESCRIPTION OF THE DRAWINGS

FIG. 1A depicts a top plan view of a designed substrate pattern;

FIG. 1B to FIG. 1E depict a top plan view of various stages of processing of a substrate, in accordance with embodiments of the disclosure;

FIG. 1F to FIG. 1I depict a side cross-sectional view of the stages of corresponding to respective FIGS. 1B to 1E;

FIG. 2A depicts a side view of processing of a device structure according to various embodiments of the disclosure;

FIG. 2B illustrates a side view after processing of the device structure according to the scenario of FIG. 2A;

FIG. 2C depicts a top plan view of the scenario of FIG. 2A;

FIG. 2D depicts a top plan view of the scenario of FIG. 2B;

FIG. 3A shows a block view of a processing apparatus according to further embodiments of the disclosure;

FIG. 3B illustrates a top plan view of an extraction geometry of the processing apparatus of FIG. 3A, according to further embodiments of the disclosure;

FIG. 3C shows a block view of another processing apparatus according to further embodiments of the disclosure;

FIG. 6 depicts an exemplary process flow, according to one embodiment;

DETAILED DESCRIPTION

Figure 5:
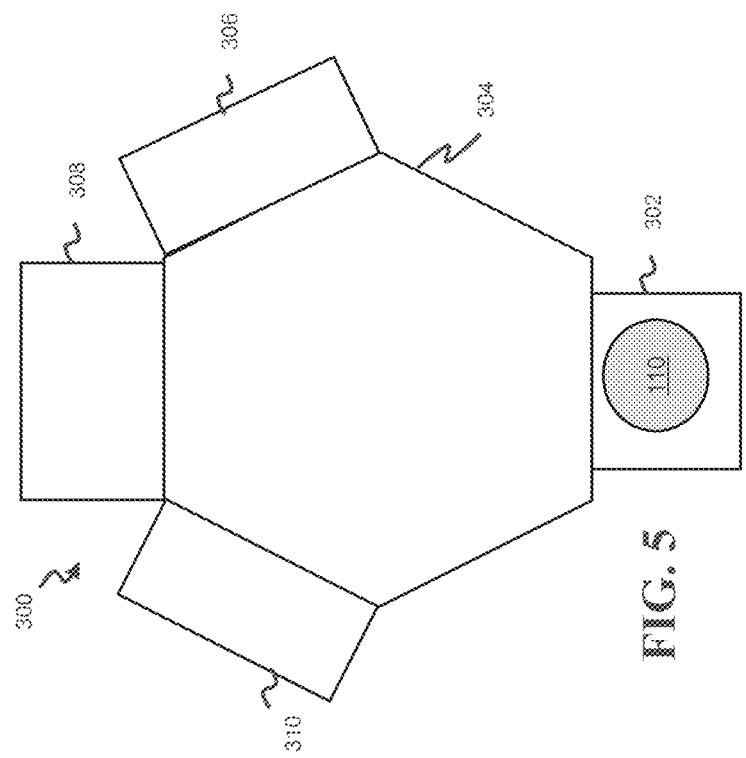
FIG. 5 illustrates another processing apparatus according to additional embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques and apparatus to pattern substrates and in particular novel techniques to etch a cavity disposed in a substrate, along a designed direction. Such processing may be deemed elongation patterning, where a feature such as a via or trench may be formed having an initial shape and size, and may be subsequently elongated along the designed direction using a series of etch operations. The designed direction may correspond to a horizontal direction within a plane of the substrate. According to various embodiments, the elongation of the feature may take place along the designed direction (first direction) while the cavity is not enlarged or enlarged to a lesser extent along a perpendicular direction to the designed direction (second direction) within the plane of the substrate. In this manner, a cavity may be selectively elongated along just one direction, providing various concomitant advantages for patterning substrates, as disclosed herein.

Various embodiments may be especially appropriate for etching patterns where the selective elongation of a cavity along a horizontal direction (Y-direction) requires a relatively large initial thickness (along a Z-direction) of a mask layer(s). By way of background, a certain layer thickness is needed to etch a given amount in the horizontal direction using angled ions, since the angled etching etches vertically and horizontally at the same time. As such, to achieve a larger amount of cavity elongation in a single layer in the horizontal direction using angled ions, the thickness of the single layer may need to be increased. This increased thickness of the single layer in turn may produce a higher aspect ratio of a patterned feature in the single layer, such as 5/1, 6/1, or higher. In such structures, the angle of incidence of ions used to perform the cavity elongation may be less than 10 degrees with respect to perpendicular to the substrate plane (horizontal plane), to prevent shadowing in the structure. This severe geometry for incident ions can significantly harm the sidewall profile of a cavity due to faster elongation at the top of the cavity than the bottom of the cavity. These relatively lower beam angles (with respect to perpendicular) may cause a much slower elongation rate in the horizontal direction, due to the glancing angle with respect to the (vertical) sidewall of the structure, rendering such extreme pattern elongation within the given layer too slow to be a practical in some applications. As detailed below, the present embodiments, by modifying such a single layer/single etch approach, may overcome these issues to provide extreme selective elongation of a cavity in a horizontal direction.

FIG. 1A illustrates a designed substrate pattern, shown as substrate pattern 100. The present embodiments enable implementation of a designed pattern in a substrate, by providing novel combinations of operations, patterning layers, and apparatus, disclosed below. The substrate pattern 100 may represent any pattern to be formed in a device in any layer. In one example, the substrate pattern 100 may represent a trench arrangement for trenches 104 to be formed in a given layer or layers within a substrate 102. As such the substrate pattern 100 may be characterized by various parameters, including a design separation S between adjacent trenches, a design length L for the trenches 104, as well as a design width W.

Turning to FIGS. 1B-1I, there is shown a series of instances during implementation of the substrate pattern 100 in a substrate 110, according to some embodiments of the disclosure. According to various embodiments, a combination of at least three etch operations may be implemented within a combination of at least two layers to implement the substrate pattern 100. By way of background, the substrate pattern 100 may represent an array of features where the design separation S, sometimes referred to as tip-to-tip distance, is smaller than the smallest separation able to be imaged using known lithographic techniques. For example, the design separation S may be on the order of 30 nm, 20 nm, or 10 nm in some cases. To address this issue the present embodiments may employ a novel combination of etching operations to selectively change the size of a feature, such as a trench or via. In particular, a trench or via may be selectively elongated along a given direction to generate a designed shape and size for the trench or via, while also adjusting the separation between trenches to achieve the design separation S.

Turning to FIG. 1B and FIG. 1E there is shown one instance in a sequence of operations for implementing the substrate pattern 100 in a substrate 110, in accordance with embodiments of the disclosure. In FIG. 1B a substrate 110 is provided where the substrate includes a substrate base 120. The substrate base 120 may represent any material, combination of materials, layer or combination of layers, as well as device structures, not explicitly shown. The pattern shown for substrate 110 includes a plurality of cavities, shown as trenches 112. The trenches 112 are characterized by a length L1 and a width W1, as well as a separation S1. In this example, the size of S1 may be much larger than the design separation S. Additionally, the trenches 112 may have a length L1 much shorter than the design length L. In the example of FIG. 1F, the trenches 112 may be implemented in a first layer 114 and a second layer 116, disposed subjacent the first layer 114. Notably, the view of FIG. 1F is along the cut A-A shown in FIG. 1B. The trenches 112 at the stage of FIG. 1B may have been formed by known processes including known lithography and etching processes, where the size, shape and separation between the trenches 112 may be conveniently implemented using known technology.

Turning now to FIG. 1C and FIG. 1G, there is shown a subsequent instance after the trenches 112 are selectively elongated along a first direction, in this example, along the Y-axis of the Cartesian coordinate system shown. As detailed with respect to FIGS. 2A-2D and FIGS. 3A-3C this selective elongation may be accomplished by use of novel angled ion beam operations. In brief, a reactive ion beam etching operation may be performed to etch the trenches parallel to the Y-axis while not etching along the X-axis, or etching along the X-axis to a lesser extent than along the Y-axis. As shown in FIG. 1C, the trenches 112 are elongated with respect to the instance in FIG. 1B, to a length L2, with a concomitant reduction in the separation to a separation S2. According to some embodiments, the elongation of trenches 112 in the operation of FIG. 1C may range between 10 nm and 50 nm, and in some cases between 30 nm and 40 nm. The embodiments are not limited in this context. Notably, the reactive ion beam etching may be provided using reactive ion etching chemistry as known in the art, for example, to selectively etch material of first layer 114 and second layer 116, with respect to material of third layer 118. Thus, in one embodiment of FIG. 1B, the elongation of trenches 112 takes place within the first layer 114 and second layer 116.

Turning now to FIG. 1D and FIG. 1I1, there is shown a subsequent instance after the trenches 112 are subject to etching in a vertical direction, meaning along the Z-axis of the Cartesian coordinate system. The vertical etching may be accomplished, for example using reactive ion etching where ions are directed vertically toward the trenches 112, resulting in the etching of first layer 114, transferring the shape and size of the trenches 112 into the third layer 118. At the same time, the first layer 114 may be completely eroded, resulting in the trenches 112 now being embodied in second layer 116 and third layer 118, while retaining the lateral dimensions as in FIG. 1C.

Turning now to FIG. 1E and FIG. 1I, there is shown a subsequent instance after the trenches 112 are further selectively elongated along the first direction, in this example, along the Y-axis of the Cartesian coordinate system shown. The selective elongation may be accomplished using a novel angled ion beam approach as detailed below. In the operation of FIG. 1E, the geometry and chemistry of the angled ion beam operation may be similar to the geometry and chemistry of the angled ion beam operation of FIG. 1C, or may differ from the operation of FIG. 1C. Thus, the trenches 112 are elongated with respect to the instance in FIG. 1D, to a length L3, with a concomitant reduction in the separation to a separation S3. According to some embodiments, the elongation of trenches 112 in the operation of FIG. 1E may range between 10 nm and 50 nm and in particular embodiments between 30 nm and 40 nm. The embodiments are not limited in this context. Notably, the reactive ion beam etching may be provided using reactive ion etching chemistry as known in the art, for example, to selectively etch material of second layer 116 and third layer 118, with respect to material of substrate base 120. Because of the operations of FIGS. 1B-1E, the trenches 112 may be selectively elongated along the Y-axis to a targeted extent, such as 20 nm to 100 nm, and 60 nm to 80 nm in some embodiments. As a result, the substrate pattern 100 may be implemented in the second layer 116 and third layer 118.

FIGS. 2A-2D provide further details of reactive angled ion beam etching operations, where such operations may be implemented in the operations of FIGS. 1C and 1E, for example. FIG. 2A depicts a side view of processing of a device structure 170 according to various embodiments of the disclosure. FIG. 2C depicts a top plan view of the scenario of FIG. 2A. The device structure 170 may include the first layer 114, second layer 116, third layer 118, as well as the substrate base 120, discussed above. A cavity 180 may be provided in the first layer 114 and second layer 116, as discussed above. In some instances, increasing the dimension of the cavity 180 selectively along a first direction and not along a second direction perpendicular to the first direction may be useful. In the example of FIG. 2A and FIG. 2C the cavity 180 may have a rectangular shape within the X-Y plane, representing a plane parallel to a substrate plane 130.

FIG. 2A and FIG. 2C illustrate an exemplary method for increasing a first cavity dimension of the cavity 180 along the direction parallel to the Y-axis. In particular, as shown in FIG. 2C, ions 182 are directed to the first layer 114 and second layer 116 in the cavity 180. As shown in the top plan view of FIG. 2C, the trajectories of ions 182, represented by the arrows, may align along a first direction, i.e., along the Y-axis. Said differently, the trajectories may be parallel to the Y-Z plane, while not lying within the X-Y plane. As shown in FIG. 2A, the trajectories of the ions 182 form a non-zero angle of incidence shown as the angle θ, with respect to a perpendicular 226 to the substrate plane 130, meaning the X-Y plane in this instance. These trajectories allow the ions 182 to strike the sidewall 114A while not striking the sidewalls 114B, where the sidewalls 114B may extend parallel to the Y-Z plane. As a result, material from the sidewall 114A may be etched, including in first layer 114 and second layer 116, while material from the sidewalls 114B is not etched.

FIG. 2B depicts a side view after processing of the device structure 170 according to the scenario of FIG. 2A. FIG. 2D depicts a top plan view of the scenario of FIG. 2B. As illustrated, along the first direction (parallel to the Y-axis) the cavity 180 is elongated along the first direction (Y-axis), while the dimension of the cavity 180 along the second direction (parallel to the X-axis) remains unchanged. Accordingly, the size of the cavity 180 may be extended selectively just along the Y-axis and not along the X-axis.

In accordance with various embodiments, the ions 180 may be directed to the device structure 170 in the presence of a reactive ambient containing a reactive species, shown as the reactive species 184, as illustrated by the black dots. The ions 182 and reactive species 184 may be provided by a suitable apparatus capable of providing reactive species as well as a beam of ions. Examples of such apparatus include plasma based apparatus having an extraction system extracting ions through an extraction aperture and directs the ions to a substrate. FIG. 2A illustrates an example of an extraction plate 206 including an extraction aperture 194 for extracting the ions 182 from a plasma 190 and directing the ions 182 to the cavity 180. The angle of incidence of the ions 182 with respect to the perpendicular 226 may be controlled by controlling parameters of a plasma system as is known, including plasma power, gas pressure, aperture size, and displacement between different portions of the extraction plate, among other factors. In some examples ions may be extracted having trajectories parallel to one another or differ among themselves by +/−5 degrees, by +/−10 degrees. This geometry allows the ions 182 to be directed as a directional beam of ions along a target direction.

FIG. 2C illustrates a top plan view of a variant of the extraction plate 206 where the extraction aperture 194 is elongated along the second direction parallel to the X-axis, meaning the dimension of the extraction aperture 194 along the X-axis is larger than the dimension of the extraction aperture 194 along the Y-axis. In some examples, the dimension of the extraction aperture 194 along the X-axis may be greater than 100 mm, while the dimension of the extraction aperture 194 along the Y-axis is less than 30 mm. The embodiments are not limited in this context. The ions 182 may accordingly form a ribbon beam having a high degree of uniformity along the X-axis, where the trajectories of ions 182 have a high degree of alignment along the Y-axis as shown. In other words, the ions 182 may form a ribbon beam having a short axis parallel to a first direction (Y-axis) and a long axis parallel to a second direction (X-axis), where the second direction is perpendicular to the first direction.

Additionally, reactive species 184 may be provided as neutrals, ions, radicals, or a combination of neutrals, ions, and radicals. Ions 182 themselves may be inert ions or may include reactive species. The combination of ions 182 and reactive species 184 may include known recipes for performing reactive ion etching of materials including silicon oxide layers, silicon nitride layers, silicon layers, carbon layers, and other materials systems. The embodiments are not limited in this context.

When ions 182 are used in conjunction with reactive species 184, where the reactive species are designed to promote reactive ion etching, this configuration enables a novel "one dimensional reactive ion etching" process where reactive ion etching can be restricted to targeted features on a substrate surface while not affecting other features. The one-dimensional reactive ion etching may differ from conventional reactive ion etching where ions directed may etch material along the vertical direction as well as along more than one direction within a plane of the substrate perpendicular to the vertical direction. For example, in conventional reactive ion etching (ashing) of via structures formed within a layer the diameter of via structures may be increased in a non-selective manner along an X-direction and Y-direction.

In the example of FIG. 2A and FIG. 2C etching may take place on surfaces of a select material where reactive species 184 are present as well as ions 182. In particular, at least some of the reactive species 184 may be neutrals where the reactive species may pass through the extraction aperture 194 while not having a particular directionality and may impinge upon various surfaces of the cavity 180, as well as surface of the first layer 114. As discussed above, and in accordance with various embodiments, the ions 182 may be restricted to impinging on the sidewall 114A, the top surface 124 of first layer 114, as well as the surface 126 of third layer 118. As regards surface 126, the ions 182 and reactive species 184 may be designed to selectively etch material of the first layer 114 and material of the second layer 116, with respect to the material of third layer 118, meaning the etch rate of first layer 114 and etch rate of the second layer 116 is higher than the etch rate of third layer 118. Accordingly, while ions 182 and reactive species 184 may impinge upon surface 126, little or no etching of third layer 118 within cavity 180 may take place in the scenario of FIG. 2A to FIG. 2D. Accordingly, after a first exposure to the ions 182 as illustrated in FIGS. 2A and 2C, the cavity 180 is elongated along the Y-axis, where the layer thickness of first layer 114 is also reduced. The loss of thickness of first layer 114 during the exposure to ions 182 may be acceptable, to the extent adequate thickness remains to pattern underlying layers. Following the sequence of FIGS. 1B-1E, the pattern of cavity 180 in FIG. 2B may be transferred to the third layer 118 using a vertical reactive ion etching operation, and may be followed by a second angled ion beam etching operation to further elongate the cavity along the Y-axis, using the geometry as generally depicted in FIG. 2A.

Returning to FIGS. 1B-1I again, the operations of FIGS. 1B-1E facilitate extreme elongation of a cavity, such as a via or a trench. Notably, while in principle elongation of a cavity may be realized in one angled ion beam operation, geometrical considerations, as well as materials considerations may limit the efficacy of this approach. For one, a given angled ion beam etching operation may be limited in the amount of lateral etching achievable along the Y-axis by the thickness of the top layer, such as first layer 114. Notably, with reference also to FIG. 2A, the reactive ion etching ambient etching the sidewalls 114A also etches the top surface 124. Thus, after a given amount of lateral etching along the Y-axis, the first layer 114 may be entirely removed. While in principle the thickness of the first layer may be increased, this increase in layer thickness may result in a cavity having an unduly high aspect ratio (height along Z-axis/width along Y-axis) for etching.

Moreover, even before the first layer 114 is entirely removed, cavities may begin to etch in a non-ideal fashion along a transverse direction. For example, the profile of cavities in the X-Z plane may begin to round after a given amount of elongation etching along the Y-axis. Accordingly, by transferring a second elongation operation into subjacent layers, such as second layer 116, and third layer 118, further elongation may be accomplished while avoiding non-ideal etching tending to occur with prolonged etching using just one layer as a top layer.

Turning now to FIG. 3A, there is shown a processing apparatus 200, depicted in schematic form. The processing apparatus 200 represents a processing apparatus for selectively etching portions of a substrate, such as sidewalls. The processing apparatus 200 may be a plasma based processing system having a plasma chamber 202 for generating a plasma 204 therein by any convenient method as known in the art. An extraction plate 206 may be provided as shown, having an extraction aperture 208, where a selective etching may be performed to selectively remove sidewall layers. A substrate, such as a substrate 110 having the aforementioned structure as shown at FIG. 1B, is disposed in the process chamber 222. A substrate plane of the substrate 100 is represented by the X-Y plane of the Cartesian coordinate system shown, while a perpendicular to the plane of the substrate 110 lies along the Z-axis (Z-direction).

During a directional etching operation, an angled ion beam 210 is extracted through the extraction aperture 208 as shown. The angled ion beam 210 may be extracted when a voltage difference is applied using bias supply 220 between the plasma chamber 202 and substrate 100 as in known systems. The bias supply 220 may be coupled to the process chamber 222, for example, where the process chamber 222 and substrate 110 are held at the same potential. In various embodiments, the angled ion beam 210 may be extracted as a continuous beam or as a pulsed ion beam as in known systems. For example, the bias supply 220 may be configured to supply a voltage difference between plasma chamber 202 and process chamber 222, as a pulsed DC voltage, where the voltage, pulse frequency, and duty cycle of the pulsed voltage may be independently adjusted from one another.

By scanning a substrate stage 214 including substrate 100 with respect to the extraction aperture 208, and thus with respect to the angled ion beam 210, along the scan direction 216, the angled ion beam 210 may etch targeted surfaces of structures, such as the trenches 112, when such structures are oriented, for example, perpendicularly to the scan direction 216, as further shown in FIG. 3B. In various embodiments, for example, the angled ion beam 210 may be provided as a ribbon ion beam having a long axis extending along the X-direction of the Cartesian coordinate system shown in FIG. 3B. The substrate 110 may be arranged, for example, where one set of sidewalls of the trenches 112 is exposed to the angled ion beam 210. For example, the trenches 112 may be oriented with the long direction of the trenches 112 is perpendicular to the long axis of the extraction aperture 208, along the X-axis, as shown in FIG. 3B. In this manner, as shown in FIG. 2A, the angled ion beam 210, forming a non-zero angle of incidence with respect to the Z-axis (normal to the substrate plane), may strike the sidewalls oriented along the X-Z plane, as noted. This geometry facilitates reactive ion etching of the X-Z sidewalls, while not etching the Y-Z sidewalls, and thus selectively elongates the trenches 112 to generate the elongated structure of trenches 112, as shown in FIG. 1C or FIG. 1E. In various embodiments, the value of the non-zero angle of incidence may vary from 10 degrees to 75 degrees, while in some embodiments the value may range between 20 degrees and 60 degrees. The embodiments are not limited in this context. The angled ion beam 210 may be composed of any convenient gas mixture, including inert gas, reactive gas, and may be provided in conjunction with other gaseous species in some embodiments. Gas may be provided from a gas source 224, where the gas source 224 may be a gas manifold coupled to provide a plurality of different gases to the plasma chamber 202. In particular embodiments, the angled ion beam 210 and other reactive species may be provided as an etch recipe to the substrate 110 so as to perform a directed reactive ion etching of targeted sidewalls of patterning layers on substrate 110. As discussed above, the etch recipe may be selective with respect to the material of the third layer 118, so as to remove material of the first layer 114 and the second layer 116, while not etching the third layer 118, or etching the third layer 118 to a lesser extent.

In the example of FIG. 3B, the angled ion beam 210 is provided as a ribbon ion beam extending to a beam width along the X-direction, where the beam width is adequate to expose an entire width of the substrate 110, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

As also indicated in FIG. 3B, the substrate 110 may be scanned in the scan direction 216, where the scan direction 216 lies in the X-Y plane, such as along the Y-direction. Notably, the scan direction 216 may represent the scanning of substrate 110 in two opposing (180 degrees) directions along the Y-direction, or just a scan toward the left or a scan toward the right. As shown in FIG. 3B, the long axis of angled ion beam 210 extends along the X-direction, perpendicularly to the scan direction 216. Accordingly, an entirety of the substrate 110 may be exposed to the angled ion beam 210 when scanning of the substrate 110 takes place along a scan direction 216 to an adequate length from a left side to right side of substrate 110 as shown in FIG. 3B.

Turning now to FIG. 3C, there is shown another processing apparatus 240, depicted in schematic form. The processing apparatus 240 represents a processing apparatus for performing angled ion treatment of a substrate, and may be substantially the same as the processing apparatus 200, save for the differences discussed below. Notably, the processing apparatus 240 includes a beam blocker 232, disposed adjacent the extraction aperture 208. The beam blocker 232 is sized and positioned to define a first aperture 208A and a second aperture 208B, where the first aperture 208A forms a first angled ion beam 210A, and the second aperture 208B forms a second angled ion beam 210B. The two angled ion beams may define angles of incidence with respect to the perpendicular 226, equal in magnitude, opposite in direction. The beam blocker offset along the Z-axis with respect to extraction plate 206 may help define the angle of the angled ion beams. As such, the first angled ion beam 210A and the second angled ion beam 210B may treat opposing sidewalls of a semiconductor fin similarly and simultaneously, as generally depicted in FIG. 3C. When configured in the shape of a ribbon beam as in FIG. 3B, these angled ion beams may expose an entirety of the substrate 110 to reactive ion etching of the trenches 112 distributed in devices across the substrate 110, by scanning the substrate platen 214 as shown. In this configuration opposite sidewalls of the trenches 112 may be etched simultaneously, elongating the trenches 112 in two opposite directions along the Y-axis in one scan operation.

In accordance with various embodiment the processing apparatus 200 or processing apparatus 240 may further include a controller 250, where the operation of controller 250 is detailed below with respect to FIG. 4. The controller 250 may be coupled to at least one of the power supply 230, bias supply 220, and substrate stage 214. The controller 250 may include various components to control angled ion beam processing of a substrate.

Figure 4:
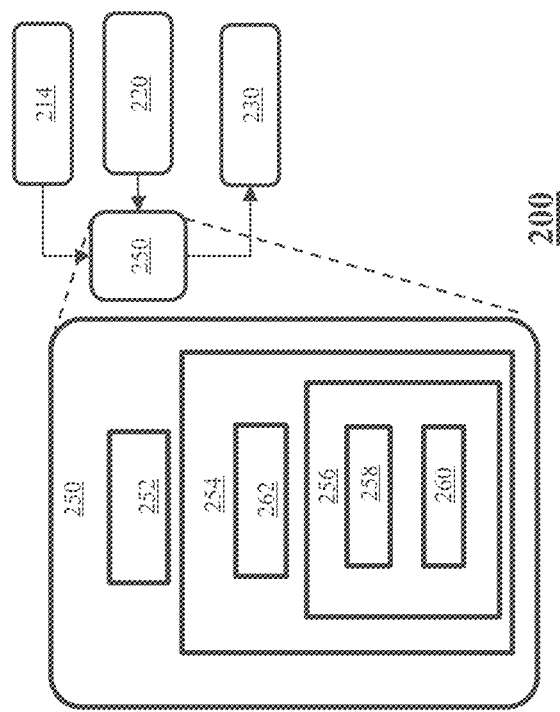
FIG. 4 illustrates details of a controller according to some embodiments of the disclosure.

Turning now to FIG. 4, a block diagram of processing apparatus 200 is shown, including controller 250, power supply 230, bias supply 220, and substrate stage 214. The controller 250 may be coupled to these components, for example, to send control signals and to receive signals from the components. The controller 250 may include a processor 252, such as a known type of microprocessor, dedicated semiconductor processor chip, general purpose semiconductor processor chip, or similar device. The controller 250 may further include a memory or memory unit 254, coupled to the processor 252194, where the memory unit 254 contains an ion beam control routine 256. The ion beam control routine 256 may be operative on the processor 252 to monitor and adjust the angled ion beam 210, as described below.

The memory unit 254 may comprise an article of manufacture. In one embodiment, the memory unit 254 may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

As further shown in FIG. 4, the ion beam control routine 256 may include an angle control processor 258, as well as a gas flow processor 260. According to some embodiments, the angle control processor 258 may receive information regarding processing of a substrate during an ion exposure. Examples of the information include timing data to indicate when an operation is to terminate or to change, as well as endpoint signals, such as a signal from an endpoint detector, such as an optical signal, emission signal, or electrical signal. These signals may indicate a given layer has been completely or partially etched, or an endpoint signal indicating the end of a timed etch has been reached.

The angle control processor 258 may be arranged to send a control signal to adjust operation of at least one of the power supply 230, bias supply 220, or substrate stage 214, based upon receipt of the endpoint signal. Said differently, the angle control processor 258 may adjust operation parameter(s) of at least one component of the processing apparatus 200 in a dynamic fashion based upon feedback during an etch operation, or series of etch operations. As an example, the angle control processor 258 may adjust operating parameters affecting the angle of incidence of the angled ion beam 210. Exemplary parameters affecting angle of incidence include plasma power, bias voltage between plasma chamber and substrate, as well as separation between extraction plate and substrate (along the Z-axis). In a particular example, by varying the separation of extraction plate and substrate between approximately 5 mm and 40 mm, the angle of incidence with respect to perpendicular to a substrate plane of angled ion beam 210 may be varied from between nearly zero to up to 40 degrees. Accordingly, in one implementation, the sequence of operations shown in FIGS.

1C, 1D and 1E may be accomplished by varying the separation between substrate 110 and extraction plate 206, to establish the targeted angle of incidence of an ion beam to perform a reactive ion etch in the different operations.

The gas flow processor 260 may be arranged to send a control signal to adjust flow of a gas or gases from the gas source 224, based upon receipt of an endpoint signal, for example. In this manner, the gas composition in the plasma chamber 202, and accordingly, the reactive ion etching chemistry, may be changed. For example, the etch chemistry may be altered according to changing of layers to be etched within a stack of layers. In some implementations, the etch chemistry may be altered between different angled ion beam etch operations, while the angle of incidence of ions in an angled ion beam remains the same between the different etch operations. In some implementations, the etch chemistry may be altered between different angled ion beam etch operations, while the angle of incidence is also changed between the different etch operations. In further implementations, the etch chemistry may remain the same between different angled ion beam etch operations, while the angle of incidence is changed between the different etch operations.

As also shown in FIG. 4, the memory unit 254 may include a database 262, where the database includes details of process parameters to be applied to etch operations to be performed for a given sequence of angled ion beam etch operations. With reference also to FIG. 1F, Table I lists exemplary etch recipes for etching the arrangement of layers shown in FIG. 1F. The first elongation etch corresponds to the operation of FIG. 1C, while the second elongation etch corresponds to the operation of FIG. 1E (the etch recipe for the vertical etch operation of FIG. 1D is not shown). Four different combinations of materials are shown for the different layers. For example, the first layer combination includes an amorphous carbon (a carbon) layer for first layer, a nitride/DARC (dielectric antireflective coating) layer for second layer 116, an oxide layer (such as silicon dioxide) for third layer 118 and a TiN or other metal for substrate base 120. Other examples may include a silicon antireflective coating (SiARC) as third layer 118. Notably, other materials may be present underneath the substrate base 120, while the term "substrate base" is used herein just for consistency, and may simply denote an additional layer disposed on a subjacent substrate.

embodiments of the disclosure. The system 300 may be used for performing the angled ion etch operations, as well as normal-incidence etch operations in accordance with the embodiments disclosed herein. The system 300 may be configured as a cluster tool, including a loadlock 302 and transfer chamber 304 to transport a substrate 110 (and in some cases a substrate stage, supporting the substrate) to and between various processing chambers. The transfer chamber 304 and processing chambers may be coupled to evacuation apparatus such as known pumping systems (not shown) for maintaining the transfer chamber 304 and other processing chambers, discussed below, under vacuum conditions, or under controlled ambient conditions. Accordingly, the substrate 110 may be transported between the various processing chambers and transfer chamber 304 without exposure to ambient. The system 300 may include a first angled ion beam etch chamber 306, coupled to the transfer chamber 304, where the substrate 110 is exposed to ions directed at a non-zero angle of incidence with respect to a normal to a substrate plane, consistent with the geometry generally shown in FIGS. 3A-3C. The first angled ion beam etch chamber 306 may constitute a plasma chamber and extraction plate, as generally described above, or may constitute plasma chamber, extraction plate, as well as process chamber, described above. The system 300 may further include a reactive ion etch chamber 308, coupled to the transfer chamber 304, and arranged as a vertical etch chamber to perform vertical etching (along the perpendicular to the substrate plane) as a known reactive ion etch chamber. The system 300 may also include a second angled ion beam etch chamber 310, coupled to the transfer chamber 304, where the substrate 110 is exposed to ions directed at a second non-zero angle of incidence with respect to a normal to a substrate plane. As such, to perform the sequence of operations shown in FIG. 1C-1E, the substrate 110 may be transported in sequence between first angled ion beam etch station 306, reactive ion etch chamber 308, and second angled ion beam etch station 310, while vacuum is not broken between operations.

While the embodiments discussed above detail elongation of cavities using two angled ion beam etching processes, in further embodiments, at least three angled ion beam etching processes may be used in a sequence of operations, to extend

TABLE I

| | 114 | 116 | 118 | 120 | First Elongation Etch | Second Elongation Etch |
|---|---|---|---|---|---|---|
| 1 | a-Carbon | Nitride/DARC | Oxide | TiN or other metal | $CH_3F:O_2$ or $CHF_3:O_2$ or $CF_4:O_2$ | $CF_4:CH_3F:Ar$ |
| 2 | a-Carbon | Nitride/DARC | Si/SiARC | Oxide | $CH_3F:O_2$ or $CHF_3:O_2$ or $CF_4:O_2$ | Cl or Cl/Ar |
| 3 | SiARC | a-Carbon | Nitride/DARC/SiCN | Oxide/Si | $Ar/O_2$ | $CH_3F:O_2$ or $CHF_3:O_2$ or $CF_4:O_2$ |
| 4 | SiARC | a-Carbon | Oxide | TiN or other metal | $Ar/O_2$ | $CF_4:CH_3F:Ar$ |

As shown in Table I. each recipe for the combination of the first elongation etch and the second elongation etch may be tailored so the first elongation etch etches first layer 114 and second layer 116 selectively with respect to third layer 118, and the second elongation etch selectively etches second layer 116 and third layer 118 with respect to the substrate base 120.

FIG. 5 presents a top plan view (X-Y plane) of an exemplary system, shown as system 300, according to the ability to elongate a cavity. Addition of a given angled ion beam etching operation may be accompanied by addition of another layer.

FIG. 6 depicts an exemplary process flow 400. At block 402, a cavity is provided within at least one layer, disposed on a substrate. The cavity may be formed within two layers of a layer stack in some embodiments. In some embodiments, a layer stack may include a total of four layers (including a substrate base layer) disposed on the substrate.

In this context, the substrate base may constitute a final layer to be patterned, while other layers or structures may be present, subjacent to the substrate base. In other embodiments, the layer stack may be three layers, and a substrate base may constitute a fourth layer, with no other layers below the substrate base. The cavity may be characterized by a first length and a first width. At block 404 a first angled ion beam etch is performed to elongate the cavity from a first length to a second length. The first angled ion beam etch may entail a reactive ion etch process where an ion beam is directed in a reactive ambient at a non-zero angle of incidence with respect to a plane (X-Y) of the substrate.

At block 406, the cavity is exposed to a reactive ion etch operation where normal-incidence ions are directed to the cavity, meaning the ions are directed along the perpendicular to the substrate plane. As such, the cavity may retain the second length after exposure to the reactive ion etch at normal incidence. In some examples, a first layer may be removed after the reactive ion etch operation, wherein a second layer, initially disposed subjacent the first layer, becomes a top layer. At the same time the cavity may be extended into a third layer, subjacent the second layer.

At block 408 a second angled ion beam etch is performed to elongate the cavity from the second length to a third length. The second angled ion beam etch may entail a second reactive ion etch process where a second ion beam is directed in a reactive ambient at a second non-zero angle of incidence with respect to the plane (X-Y) of the substrate. In some embodiments, after the operations of blocks 404-408 the cavity may retain the first width.

The present embodiments provide various advantages over conventional processing to define features in a substrate. One advantage lies in the ability to selectively elongate a cavity along just one direction, while preserving the dimension of the cavity along a second direction, perpendicular to the first direction. Another advantage is the ability to reduce cavities below the spacing achieved by known lithography processes. An example of this ability is the reduction of tip-to-tip separation between adjacent trenches such as contact trenches. A further advantage is the ability to reduce the number of masks used to generate a pattern of features, where the features may be separated by a distance less than the threshold separation achievable by a single mask. This reducing the number of masks has the further advantageous effect of reducing overlay error for printing the pattern of features.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of patterning a substrate including a plurality of layers disposed atop a substrate base, the method comprising:
    providing a cavity in the plurality of layers, the cavity extending to a first depth in the plurality of layers, and the cavity having a first length along a first direction and a first width along a second direction, perpendicular to the first direction;
    directing first angled ions in a first exposure to the cavity, wherein after the first exposure the cavity has a second length, greater than the first length;
    directing normal-incidence ions in a second exposure to the cavity, wherein the cavity retains the second length after the second exposure, wherein a topmost layer of the plurality of layers is removed, and wherein the cavity is extended to a second depth to expose the substrate base; and
    directing second angled ions to the cavity in a third exposure, subsequent to the second exposure, wherein the cavity has a third length, greater than the second length, after the third exposure;
    wherein the first angled ions form a first ribbon beam having a first long axis, parallel to the second direction and a first short axis, parallel to the first direction, and wherein the second angled ions form a second ribbon beam having a second long axis parallel to the second direction and a second short axis parallel to the first direction.

2. The method of claim 1, wherein the plurality of layers comprises at least three layers, and wherein the cavity is disposed in a first layer and in a second layer, subjacent the first layer, before the first exposure.

3. The method of claim 2, wherein the cavity is extended into a third layer, subjacent the second layer, after the second exposure.

4. The method of claim 3, wherein the first layer is removed after the second exposure.

5. The method of claim 1, wherein the first angled ions are directed in a presence of a first reactive ambient, along a first trajectory at a first non-zero angle of incidence with respect to a perpendicular to a plane of the substrate, the first trajectory being aligned with the first direction, and wherein the second angled ions are directed in a presence of a second reactive ambient, along a second trajectory at a second non-zero angle of incidence with respect to the perpendicular to the plane of the substrate, the second trajectory being aligned with the first direction.

6. The method of claim 5, wherein the first non-zero angle of incidence comprises at least 10 degrees, and the second non-zero angle of incidence comprises at least 10 degrees.

7. The method of claim 1, wherein the normal-incidence ions are directed along a perpendicular to a plane of the substrate in the presence of a third reactive ambient.

8. The method of claim 1, wherein the plurality of layers comprises at least two layers, and wherein the cavity is disposed in a first layer before the first exposure, and wherein the cavity is extended into a second layer after the second exposure.

9. The method of claim 1, wherein the second length exceeds the first length by 20 nm to 50 nm, and wherein the third length exceeds the first length by 60 nm to 80 nm.

10. The method of claim 1, wherein the first width does not increase after the first exposure, and wherein the first width does not increase after the second exposure.

* * * * *